(12) United States Patent
Mokhtari et al.

(10) Patent No.: US 6,215,369 B1
(45) Date of Patent: Apr. 10, 2001

(54) CONTROLLABLE OSCILLATOR WITH FEEDBACK FOR REDUCING DC LEVEL OF OUTPUT SIGNALS

(75) Inventors: Mehran Mokhtari, Stockholm; Harald Jacobsson, Västra Frölundra, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/444,831

(22) Filed: Nov. 22, 1999

(30) Foreign Application Priority Data

Nov. 22, 1998 (SE) .................................................. 9803992

(51) Int. Cl.$^7$ ....................................................... H03K 3/26
(52) U.S. Cl. ..................... 331/108 R; 331/144; 331/176; 331/177 R; 331/113 R
(58) Field of Search .............................. 331/108 R, 144, 331/113 R, 176, 177 R

(56) References Cited

U.S. PATENT DOCUMENTS 5,357,220  10/1994  Francis .......................... 331/113 R

FOREIGN PATENT DOCUMENTS 39 38 760 A1   5/1991 (DE) .
0 685 928 A1  12/1995 (EP) .
97/43828      11/1997 (WO) .

*Primary Examiner*—Arnold Kinkead
(74) *Attorney, Agent, or Firm*—Nixon & Vanderhye P.C.

(57) ABSTRACT

A controllable oscillator, comprising a first $(R_c,M_{s1},M_{s2},R'_c)$ and a second $(R_1,M_{i1},M_{i2},R_2)$ amplifier which are provided with inputs $(V_{cc},V_{ee})$ for supply voltage and at least one controllable current source $(I_1,I_2)$ for controlling the output frequency of the oscillator. Both amplifiers comprise a first $(R_c,M_{s1};R_1,M_{i1})$ and a second $(R'_c,M_{s2};R_2,M_{i2})$ branch, where both the first and the second branch have an input $(M_{s1},M_{s2};M_{i1},M_{i2})$ and an output $(V_{out},NV_{out};V'_{out},NV'_{out})$ for electrical signals. The output $(V_{out})$ of the first branch of the first amplifier is connected to the input $(M_{i2})$ of the second branch of the second amplifier, and the output $(NV_{out})$ of the second branch of the first amplifier is connected to the input $(M_{i1})$ of the first branch of the second amplifier. The output $(V'_{out})$ of the first branch of the second amplifier is connected to the input $(M_{s1})$ of the first branch of the first amplifier, and the output $(NV'_{out})$ of the second branch of the second amplifier is connected to the input $(M_{s2})$ of the second branch of the first amplifier. In addition, the output $(V_{out})$ of the first branch of the first amplifier is fed back to the input $(M_{s1})$ of the first branch of the first amplifier, and the output $(NV_{out})$ of the second branch of the first amplifier is fed back to the input $(M_{s2})$ of the second branch of the first amplifier, both of which feedbacks are done via means $(M_{r1},M_{r2})$ for reducing the DC level of the signals from the outputs and for matching the impedances between the first and the second amplifier.

13 Claims, 3 Drawing Sheets

CONTROLLABLE OSCILLATOR WITH FEEDBACK FOR REDUCING DC LEVEL OF OUTPUT SIGNALS

TECHNICAL FIELD

The present invention relates to a controllable oscillator, in particular a current controlled oscillator.

BACKGROUND ART

Controllable oscillators are a type of component which are very common in modern electronics. Such oscillators can either be voltage controlled, so-called VCOs (Voltage Controlled Oscillator), or current controlled, CCOs (Current Controlled Oscillator). What is controlled in a CCO/VCO is the output frequency of the oscillator.

It is of course important that the frequency of a controllable oscillator can be controlled over a wide range without the amplitude of the signal varying too much, that the noise level of the signal is low, and that the frequency can be high. Taking into account trends in modern electronics, it is also important that a controllable oscillator takes up as little space as possible, and of course that it is as cheap as possible.

DESCRIPTION OF THE INVENTION

The problem to be solved by the present invention is thus to produce a controllable oscillator which can have a high output frequency with a low noise level, is compact, cheap to produce, and has a broad modulation range with retained amplitude.

This problem is solved using a controllable oscillator which comprises a first and a second amplifier which are provided with inputs for supply voltage and at least one controllable current source for controlling the output frequency of the oscillator. Each amplifier comprises a first and a second branch, where both the first and the second branch have an input and an output for electrical signals.

The output of the first branch of the first amplifier is connected to the input of the second branch of the second amplifier, and the output of the second branch of the first amplifier is connected to the input of the first branch of the second amplifier. In addition, the output of the first branch of the second amplifier is connected to the input of the first branch of the first amplifier, and the output of the second branch of the second amplifier is connected to the input of the second branch of the first amplifier.

In a variant of the invention, the controllable oscillator also comprises a third and a fourth amplifier, which amplifiers each have an input and an output for electrical signals, and a controllable current source for controlling the output frequency of the oscillator. In this embodiment, the output of the first branch of the first amplifier is connected to the input of the fourth amplifier, and the output of the second branch of the first amplifier is connected to the input of the third amplifier. The output of the third amplifier is connected to the input of the first branch of the second amplifier, and the output of the fourth amplifier is connected to the input of the second branch of the second amplifier.

In both these variants of the invention, the first and second branches of the first and the second amplifier each preferably comprise a resistance connected in series with a transistor. This design of the amplifiers make the oscillator according to the invention compact and cheap to produce.

In both the abovementioned variants of the invention, the output of the first branch of the first amplifier is fed back to the input of the first branch of the first amplifier, and the output of the second branch of the first amplifier is fed back to the input of the second branch of the first amplifier. Both of these feedbacks are suitably done via means for reducing the DC level of the signals from the outputs and for matching the impedances between the first and the second amplifier.

In addition, in both the abovementioned variants of the invention, the outputs of the first amplifier are also suitably connected to the respective next amplifier via means for reducing the DC level of the signal from the outputs of the first amplifier and for matching the impedances between the first amplifier and the next amplifier.

If the feed-back in the first amplifier comprises means for connecting the outputs of the first amplifier to the respective next amplifiers, and these means comprise a transistor, the compact and cheap design of the oscillator is retained.

In addition, in an oscillator according to the invention there is preferably a phase shift between the signals at the outputs of the first and second branches of the respective amplifiers, which suitably amounts to 180 degrees.

In addition to the advantages mentioned above, an oscillator according to the invention has a low power consumption, is relatively unaffected by temperature and is relatively unaffected by interference. As an oscillator according to the invention can be constructed without external components, it can in addition be integrated in a single chip.

BRIEF DESCRIPTION OF THE FIGURES

In the following the invention will be described in greater detail, utilizing examples of embodiments and with reference to the attached figures, where.

PREFERRED EMBODIMENTS

Figure 1:
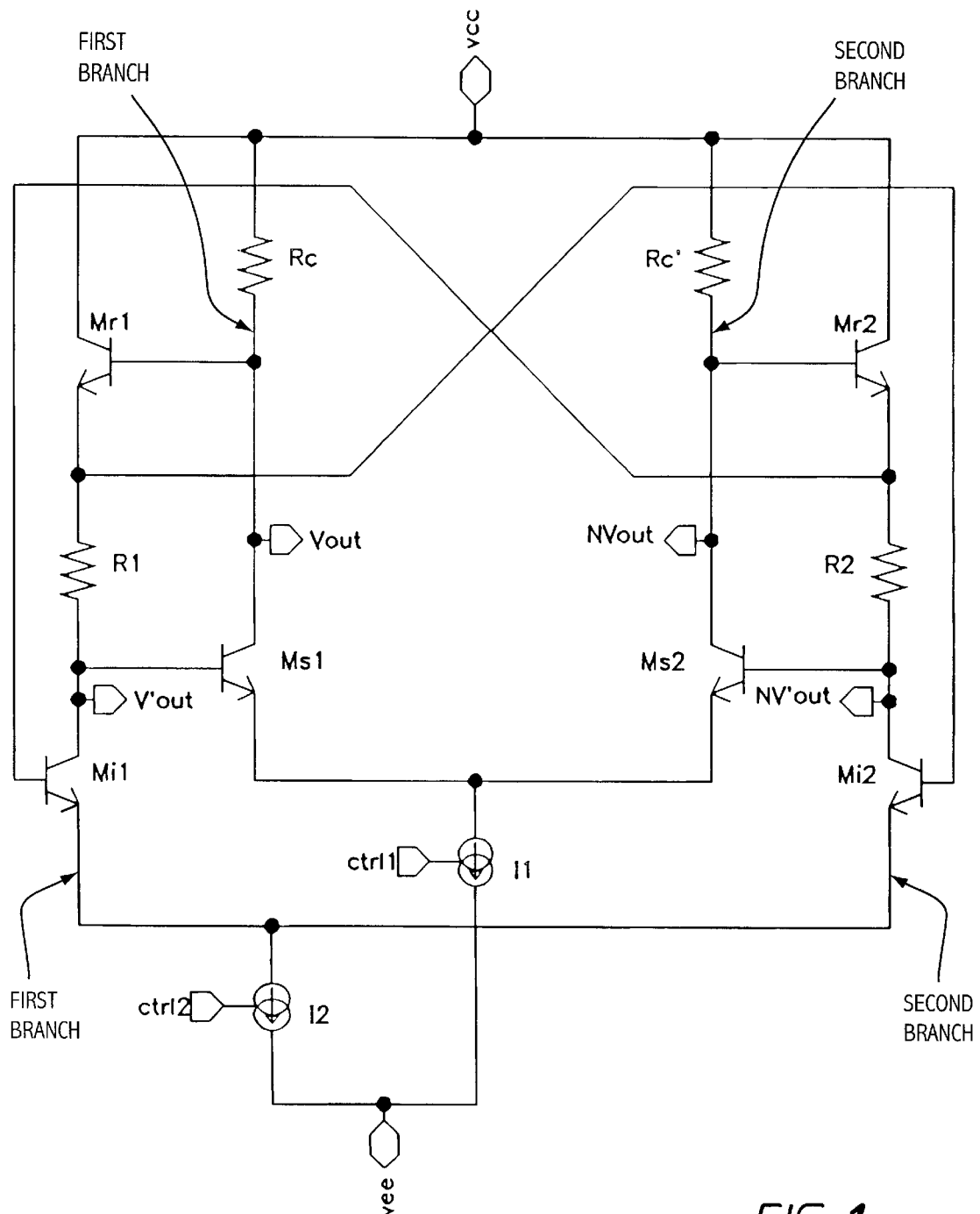
FIG. 1 shows a circuit diagram of the invention in a basic embodiment.

FIG. 1 shows a controllable oscillator 100 according to the invention in a basic embodiment. The oscillator 100 is provided with inputs for supply voltage ($V_{cc}, V_{ee}$) and in this embodiment comprises a first ($R_c, M_{s1}, M_{s2}, R'_c$) and a second ($R_1, M_{i1}, M_{i2}, R_2$) amplifier, which each comprises a first and a second branch.

Each of the two branches of the amplifiers comprises a resistance ($R_c, R_c'; R_1, R_2$) which is connected to the collector of a bipolar transistor ($M_{s1}, M_{s2}; M_{i1}, M_{i2}$). The emitters of the transistors are both connected to controllable current sources ($I_1, I_2$), one for each amplifier, which are used to control the oscillator frequency. The input of each amplifier's first and second branches will then be the base of the transistor of the respective branch, and the output of the respective branch of the respective amplifiers is defined at a point ($V_{out}, Nv_{out}, V'_{out}, NV'_{out}$) between the resistance and the transistor's collector.

As shown in FIG. 1, the oscillator according to the invention is symmetrical, in other words the first and second branches of the two amplifiers are alike. On account of the symmetry of the oscillator, the output signals from the two branches of the respective amplifiers will be phase-shifted in relation to each other, with a phase difference of 180 degrees. With an oscillator without symmetry, other phase differences can be obtained.

The inputs of the first and second branches of the second amplifier consist, as mentioned above, of the base of the transistor of the respective branch ($M_{i1}, M_{s1}, M_{s2}, M_{i2}$). In the circuit according to the invention, the output ($V_{out}$) of the first branch of the first amplifier is connected to the input ($M_{i2}$) of the second branch of the second amplifier, and the output ($NV_{out}$) of the second branch of the first amplifier is connected to the input ($M_{i1}$) of the first branch of the second amplifier.

In order for the DC level of the output signal from the outputs ($V_{out}, NV_{out}$) of the first amplifier to be adapted to a level which is suitable for the inputs of the second amplifier, the connection to the inputs of the second amplifier is preferably carried out via means for reducing the DC level.

The impedance levels of the first and second amplifiers can also suitably be matched to each other, which is achieved by the connections between the outputs of the first amplifier and the inputs of the second amplifier being carried out via means for matching the impedance levels. In a preferred embodiment which is shown in FIG. 1, these means are the same as the means for reducing the DC levels of the inputs of the second amplifier, and consist of bipolar transistors ($M_{r1}, M_{r2}$) connected as emitter followers. An alternative name for an emitter follower is common collector coupling.

In addition, the output signal ($V'_{out}, NV'_{out}$) from each branch of the second amplifier is connected to the input ($M_{s1}, M_{s2}$) of the corresponding branch of the first amplifier.

In order for the oscillator to achieve the desired function, the outputs ($V_{out}, NV_{out}$) of both branches of the first amplifier are in addition fed back to the inputs ($M_{s1}, M_{s2}$) of their respective branches via means ($M_{r1}, M_{r2}$) for reducing the DC level of the signal from the outputs and for matching the impedances between the first and the second amplifier. Thus, the output of the first branch of the first amplifier is fed back to the input of the first branch of the first amplifier, and the output of the second branch of the first amplifier is fed back to the input of the second branch of the first amplifier.

As shown in FIG. 1, the means for feed-back in both branches of the first amplifier suitably comprise the same transistors ($M_{r1}, M_{r2}$) that are used for reducing the DC level of the signal from the outputs of the first amplifier and for matching the impedances between the first amplifier and the next amplifier.

The feed-back of the outputs of the first and second branches of the first amplifier to their respective inputs is carried out via the outputs ($V'_{out}, NV'_{out}$) of the corresponding branch of the second amplifier. This means that the feed-back is carried out via the abovementioned transistors ($M_{r1}, M_{r2}$) and in addition via the resistances (R1,R2) in the respective branches of the second amplifier, which affects the level of feed-back. By dimensioning the resistances in the second amplifier, the level of feed-back in the first amplifier can thus be affected.

Figure 2:
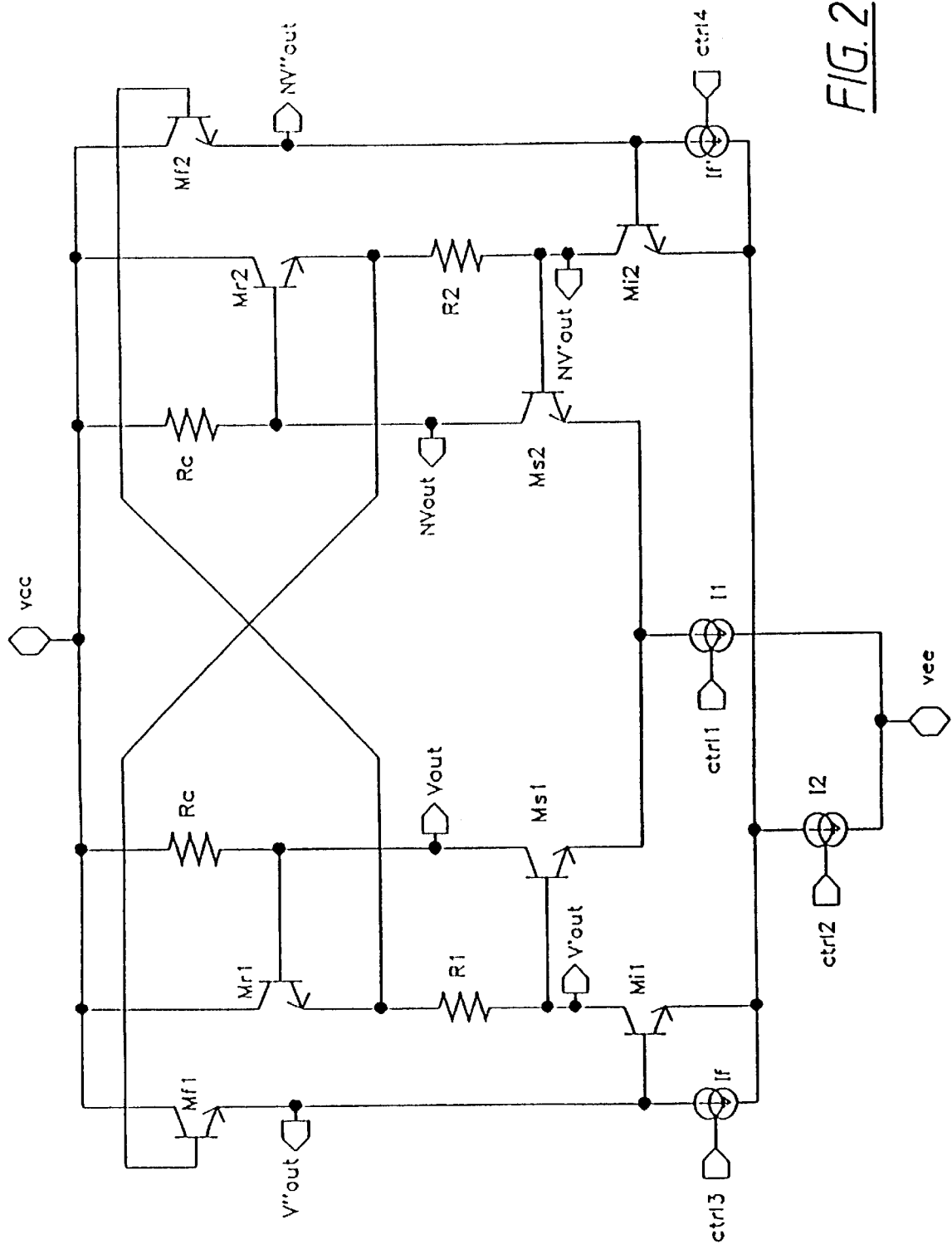
FIG. 2 shows a circuit diagram of an alternative embodiment of the invention with increased modulation range.

In a variant of the invention, which is shown in FIG. 2, the oscillator can comprise a third ($M_{f1}$) and a fourth ($M_{f2}$) amplifier, which amplifiers each have an input ($M_{f1}, M_{f2}$) and an output ($V''_{out}, NV''_{out}$) for electrical signals and a controllable current source ($I_f, I_f'$) for controlling the output frequency of the oscillator. The reason for including a third and a fourth amplifier in the oscillator 200 is that this further increases the modulation range of the oscillator with essentially retained amplitude.

The third and fourth amplifiers each suitably comprise a bipolar transistor ($M_{f1}, M_{f2}$), where the inputs of the amplifiers are the base of the respective transistors. The outputs of the third ($V''_{out}$) and fourth ($NV''_{out}$) amplifiers are defined as the respective transistor's emitter. As shown in FIG. 2, the transistors in these additional amplifiers are connected to the supply voltage ($V_{cc}$) via their collectors and to their respective controllable current source ($I_f, I_f'$) via their emitters.

In this embodiment of the invention, the output ($V_{out}$) of the first branch of the first amplifier is connected to the input ($M_{f2}$) of the fourth amplifier, and the output ($NV_{out}$) of the second branch of the first amplifier is connected to the input ($M_{f1}$) of the third amplifier. The output ($V''_{out}$) of the third amplifier is connected to the input ($M_{i1}$) of the first branch of the second amplifier, and the output ($NV''_{out}$) of the fourth amplifier is connected to the input ($M_{i2}$) of the second branch of the second amplifier.

As with the embodiment described in connection with FIG. 1, in this embodiment the outputs ($V_{out}, NV_{out}$) of both branches of the first amplifier are fed back to the input ($M_{s1}, M_{s2}$) of their respective branches via means ($M_{r1}, M_{r2}$) for reducing the DC level of the signal from the outputs, and for matching the impedances between the first and the second amplifiers. Thus, the output of the first branch of the first amplifier is fed back to the input of the first branch of the first amplifier, and the output of the second branch of the first amplifier is fed back to the input of the second branch of the first amplifier. As shown in FIG. 2, what has been said in connection with the embodiment in FIG. 1 regarding feed-back in the branches of the first amplifier and the connections between the outputs of the first amplifier and the next amplifier also applies for this embodiment of the invention, for which reason this will not be described again here.

Figure 3:
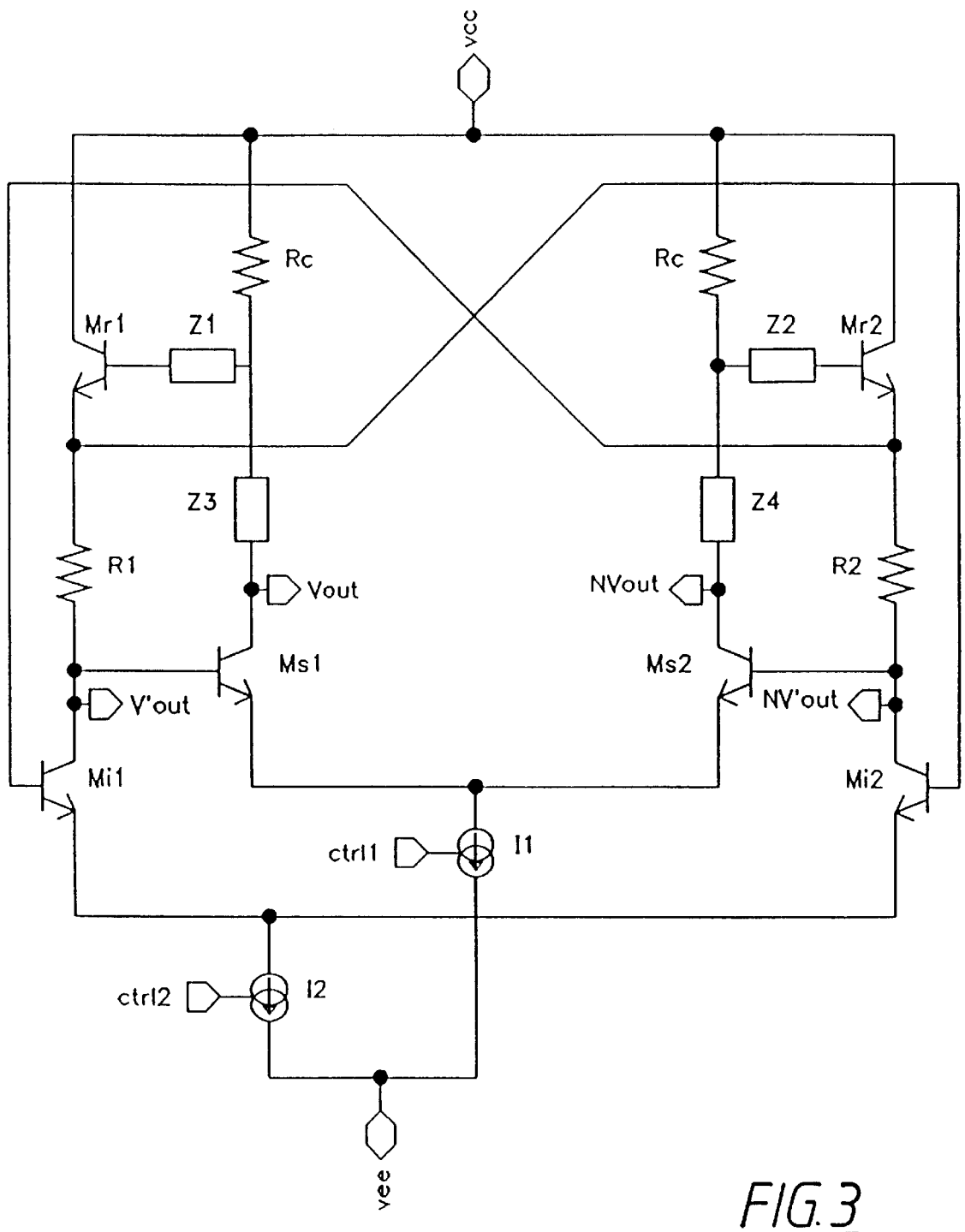
FIG. 3 shows the invention in the same embodiment as in FIG. 1, but with increased impedance matching.

In order to improve the noise characteristics of the oscillator, an additional impedance matching can be made between the first and the second amplifier, which is shown in FIG. 3. This impedance matching between the first and the second amplifier can of course also be applied when the oscillator comprises a third and a fourth amplifier.

The additional impedance matching suitably in each branch of the first amplifier comprises a first impedance (Z3,Z4), suitably an inductance, connected between the collector of the transistor and the resistance of the branch (Rc,Rc'), and also a second impedance (Z1,Z2) also suitably an inductance, connected between the resistance (Rc,Rc') of the branch and the input ($M_{r1}, M_{r2}$) of the respective emitter follower. These inductances (Z1,Z2,Z3,Z4) can also be replaced by capacitances, or by a suitable combination of resistance, capacitance and inductance.

In order to retain the symmetry in the oscillator, the first impedance (Z3,Z4) and the second impedance (Z1,Z2) should be of equal impedance in both branches.

In an alternative variant of all the embodiments which have been described above, at least one of the first amplifier's resistances ($R_c, R'_c$) can be replaced by an inductance ($L_c$), which would increase the output frequency of the oscillator considerably, and in addition reduce the noise.

In many electronics applications it is desirable to obtain the same signal at two outputs, where the phase position of the two outputs are phase-shifted by ninety degrees in relation to each other, so-called I- and Q-channels. This can be achieved in an oscillator according to the invention by suitable dimensioning of the means ($M_{r1}, M_{r2}$) for reducing the DC level, the means ($M_{r1}, M_{r2}$) for matching the impedances between the first and the second amplifier, and the resistances ($R_1, R_2$) of the second amplifier, so that there is a phase difference of ninety degrees between the output signals of the first branches ($V_{out}, V'_{out}$) of the respective amplifiers, which will also be the case for the output signals of the second branches ($NV_{out}$, $NV'_{out}$) of the respective amplifiers. The abovementioned dimensioning can also be carried out in such a way that a signal which is phase-shifted ninety degrees from the output signal ($V_{out}$, $NV_{out}$) of the respective branches of the first amplifier can be taken out at a point in the corresponding branch of the second amplifier, between the second amplifier's resistance ($R_1$, $R_2$) and the emitter follower ($M_{r1}$, $M_{r2}$) to which the resistance is connected.

The invention is not limited to the examples of embodiments described above, but can be varied freely within the scope of the patent claims. For example, one or more of the resistances in the oscillator can be replaced by any other type of impedance component, such as inductances.

In the text above, and in the diagrams which have been used to describe the invention, the transistors in the oscillator have been described and shown as bipolar transistors. However, as those skilled in the field know, a large number of other types of transistor can be used in an oscillator according to the invention, such as for example field-effect (FET) transistors. In this case, in a way known to those skilled in the field, the base, emitter and collector of the bipolar transistor are replaced by the gate, source and drain of the field-effect transistor. Other possible types of transistors include HEMT, HBT and CMOS transistors.

Throughout in the diagrams, the oscillator has been shown as current controlled, CCO, but those skilled in the field will realize that the oscillator can equally well be voltage controlled, in order words a VCO. In this case, the current control is achieved using a converter between voltage and current, by which a VCO is obtained.

The reductions in DC levels after the first amplifier and the impedance matching between the first and second amplifiers which have been described above can be carried out in a large number of different ways well-known to those skilled in the field and of course do not need to be carried out in one and the same component.

In the diagrams, the controllable current sources ($I_1$, $I_2$) in the first and the second amplifier have throughout been shown as two separate controllable current sources. An alternative solution within the framework of this invention is to let the first amplifier and the second amplifier share a common controllable current source.

What is claimed is:

1. A controllable oscillator, comprising a first ($R_c$, $M_{s1}$, $M_{s2}$, $R'_c$) and a second ($R_1$, $M_{i1}$, $M_{i2}$, $R_2$) amplifier which are provided with inputs ($V_{cc}$, $V_{ee}$) for supply voltage and at least one controllable current source ($I_1$, $I_2$) for controlling the output frequency of the oscillator, which amplifiers both comprise a first ($R_c$, $M_{s1}$; $R_1$, $M_{i1}$) and a second ($R'_c$, $M_{s2}$; $R_2$, $M_{i2}$) branch, where both the first and the second branch have an input ($M_{s1}$, $M_{s2}$; $M_{i1}$, $M_{i2}$) and an output ($V_{out}$, $NV_{out}$; $V'_{out}$, $NV'_{out}$) for electrical signals, characterized in that the output ($V_{out}$) of the first branch of the first amplifier is connected to the input ($M_{i2}$) of the second branch of the second amplifier, the output ($NV_{out}$) of the second branch of the first amplifier is connected to the input ($M_{i1}$) of the first branch of the second amplifier, the output ($V'_{out}$) of the first branch of the second amplifier is connected to the input ($M_{s1}$) of the first branch of the first amplifier, the output ($NV'_{out}$) of the second branch of the second amplifier is connected to the input ($M_{s2}$) of the second branch of the first amplifier, the output ($V_{out}$) of the first branch of the first amplifier is fed back to the input ($M_{s1}$) of the first branch of the first amplifier, and the output ($NV_{out}$) of the second branch of the first amplifier is fed back to the input ($M_{s2}$) of the second branch of the first amplifier, both of which feedbacks are done via means ($M_{r1}$, $M_{r2}$) for reducing the DC level of the signals from the outputs and for matching the impedances between the first and the second amplifier.

2. A controllable oscillator, comprising a first ($R_c$, $M_{s1}$, $M_{s2}$, $R'_c$) and a second ($R_1$, $M_{i1}$, $M_{i2}$, $R_2$) amplifier which are provided with inputs ($V_{cc}$, $V_{ee}$) for supply voltage and at least one controllable current source ($I_1$, $I_2$, $I_f$, $I_f$) for controlling the output frequency of the oscillator, which amplifiers both comprise a first ($R_c$, $M_{s1}$; $R_1$, $M_{i1}$) and a second ($R'_c$, $M_{s2}$; $R_2$, $M_{i2}$) branch, which first and second branches both have an input ($M_{s1}$, $M_{s2}$; $M_{i1}$, $M_{i2}$) and an output ($V_{out}$, $NV_{out}$; $V'_{out}$, $NV'_{out}$) for electrical signals, in addition comprising a third ($M_{f1}$) and a fourth ($M_{f2}$) amplifier, which amplifiers each have an input ($M_{f1}$, $M_{f2}$) and an output ($V''_{out}$, $NV''_{out}$) for electrical signals and a controllable current source for controlling the output frequency of the oscillator, which oscillator is characterized in that the output ($V_{out}$) of the first branch of the first amplifier is connected to the input ($M_{f2}$) of the fourth amplifier, the output ($NV_{out}$) of the second branch of the first amplifier is connected to the input ($M_{f1}$) of the third amplifier, the output ($V''_{out}$) of the third amplifier is connected to the input ($M_{i1}$) of the first branch of the second amplifier, the output ($NV''_{out}$) of the fourth amplifier is connected to the input ($M_{i2}$) of the second branch of the second amplifier, the output ($V_{out}$) of the first branch of the first amplifier is fed back to the input ($M_{s1}$) of the first branch of the first amplifier, and the output ($NV_{out}$) of the second branch of the first amplifier is fed back to the input ($M_{s2}$) of the second branch of the first amplifier, both of which feedbacks are done via means ($M_{r1}$, $M_{r2}$) for reducing the DC level of the signals from the outputs and for matching the impedances between the first and the second amplifier.

3. A controllable oscillator according to claim 1, in which the outputs ($V_{out}$, $NV_{out}$) of the first amplifier are connected to the second amplifier ($M_{i1}$, $M_{i2}$) via means ($M_{r1}$, $M_{r2}$) for reducing the DC level of the signals from the outputs of the first amplifier and for matching the impedances between the first amplifier and the next amplifier.

4. A controllable oscillator according to claim 3, in which the means ($M_{r1}$, $M_{r2}$) for feed-back of the outputs of the respective branches of the first amplifier to the corresponding inputs comprise the means ($M_{r1}$, $M_{r2}$) for reducing the DC level of the signals from the outputs of the first amplifier and for matching the impedances between the first amplifier and the next amplifier.

5. A controllable oscillator according to claim 2, in which there is a phase shift between the signals of the outputs ($V_{out}$, $NV_{out}$; $V'_{out}$, $NV'_{out}$) of the first and second branches of the first and second amplifiers, and between the outputs ($V''_{out}$, $NV''_{out}$) of the third ($M_{f1}$) and fourth ($M_{f2}$) amplifiers.

6. A controllable oscillator according to claim 5, in which the said phase shift is the same and amounts to 180 degrees.

7. A controllable oscillator according to claim 1, in which the first and the second branches of the first and the second amplifiers each comprise a resistance ($R_1$, $R_c$; $R'_c$, $R_2$) connected in series with a transistor ($M_{i1}$, $M_{s1}$; $M_{s2}$, $M_{i2}$).

8. A controllable oscillator according to claim 1, in which the means ($M_{r1}$, $M_{r2}$) for feed-back of the outputs of the first and second branches of the first amplifier to the corresponding inputs in addition comprise resistances (R1, R2) in the corresponding branches of the second amplifier.

9. A controllable oscillator according to claim 1, where said amplifiers comprise bipolar junction transistors the inputs of which consist of the bases of the respective transistors.

10. A controllable oscillator according to claim 1, in which third and fourth amplifiers are provided each comprising a bipolar transistor ($M_{f1}$, $M_{f2}$), with the collector connected to the supply voltage ($V_{cc}$) and the emitter connected to a controllable current source ($I_f$, $I'_f$), the two branches of the first and second amplifiers each comprise a resistance ($R_1$, $R_c$, $R_2$, $R_c'$) connected to the collector of a bipolar transistor ($M_{i1}$, $M_{s1}$, $M_{s2}$, $M_{i2}$) and the emitter of the respective transistor is connected to a controllable current source ($I_1$, $I_2$) for each amplifier, which is used to control the output frequency of the oscillator, the said means for feed-back, reducing the DC levels and impedance matching consist of a bipolar transistor ($M_{r1}$, $M_{r2}$) with the resistances ($R_1$, $R_2$) in the respective branches of the second amplifier connected to the emitter of this transistor, and with its collector connected to the supply voltage ($V_{cc}$) and its base connected to the output ($V_{out}$, $NV_{out}$) from the corresponding branch of the first amplifier, all the current sources are connected to the supply voltage ($V_{ee}$).

11. A controllable oscillator according to claim 1, in which at least one of two resistances ($R_c$, $R_c'$) of the first amplifier is replaced by an inductance ($L_c$, $L_c'$).

12. A controllable oscillator according to claim 1, in which the means ($M_{r1}$, $M_{r2}$) for reducing the DC level, the means ($M_{r1}$, $M_{r2}$) for matching the impedances between the first and the second amplifier, and first and second resistances ($R_1$, $R_2$) of the second amplifier are selected so that the output signals for the first ($V_{out}$, $NV_{out}$) and the second ($V'_{out}$, $NV'_{out}$) branch of the respective amplifiers have a phase shift of ninety degrees.

13. A controllable oscillator according to claim 1, in which the means ($M_{r1}$, $M_{r2}$) for reducing the DC level, the means ($M_{r1}$, $M_{r2}$) for matching impedances between the first and the second amplifier, and resistances ($R_1$, $R_2$) of the second amplifier are selected so that the output signals ($V_{out}$, $NV_{out}$) from the respective branches of the first amplifier, and the signal at a point in the corresponding branch of the second amplifier between resistances ($R_1$, $R_2$) of the second amplifier and the means ($M_{r1}$, $M_{r2}$) to which the resistances are connected have a phase difference of ninety degrees.

* * * * *